United States Patent
Tsai et al.

(10) Patent No.: US 7,858,969 B2
(45) Date of Patent: Dec. 28, 2010

(54) ORGANIC THIN FILM TRANSISTOR AND METHOD FOR MANUFACTURING THE SAME

(75) Inventors: Yi-Yun Tsai, Penghu County (TW); Chuan-Yi Wu, Taipei (TW); Chin-Chuan Lai, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 889 days.

(21) Appl. No.: 11/737,769

(22) Filed: Apr. 20, 2007

(65) Prior Publication Data

US 2008/0157064 A1 Jul. 3, 2008

(30) Foreign Application Priority Data

Jan. 2, 2007 (TW) .............................. 96100086 A

(51) Int. Cl.
H01L 51/10 (2006.01)
H01L 51/40 (2006.01)

(52) U.S. Cl. ................. 257/40; 438/99; 257/E51.006

(58) Field of Classification Search .............. 257/40, 257/E51.001–E51.052; 438/99
See application file for complete search history.

(56) References Cited

U.S. PATENT DOCUMENTS

| | | | | |
|---|---|---|---|---|
| 6,828,582 B1 * | 12/2004 | Ando et al. | | 257/40 |
| 6,919,158 B2 * | 7/2005 | Kawamura et al. | | 430/270.1 |
| 7,459,338 B2 * | 12/2008 | Nakayama et al. | | 438/99 |
| 2004/0191952 A1 | 9/2004 | Shtein et al. | | |
| 2004/0238816 A1 * | 12/2004 | Tano et al. | | 257/40 |
| 2005/0233065 A1 * | 10/2005 | Kisu et al. | | 427/58 |
| 2005/0242342 A1 | 11/2005 | Suh et al. | | |
| 2006/0027805 A1 | 2/2006 | Koo et al. | | |
| 2006/0157692 A1 * | 7/2006 | Wada et al. | | 257/40 |

(Continued)

FOREIGN PATENT DOCUMENTS

| | | |
|---|---|---|
| CN | 1462484 | 12/2003 |
| CN | 1540776 | 10/2004 |
| WO | WO 2006049288 A1 * | 5/2006 |
| WO | WO 2007004033 A2 * | 1/2007 |

OTHER PUBLICATIONS

Ando, M., et al. "Self-Aligned Self-Assembly Process for Fabricating Organic Thin-Film Transistors." Appl. Phys. Lett., vol. 85 (2004): pp. 1849-1851.*

(Continued)

Primary Examiner—Matthew W Such
(74) Attorney, Agent, or Firm—Jianq Chyun IP Office

(57) ABSTRACT

An organic thin film transistor including a substrate, a gate, a gate insulator, an adhesive layer, a metal nano-particle layer and an organic semiconductor layer is provided. The gate is disposed on the substrate. The gate insulator is disposed on the gate and the substrate. The adhesive layer is disposed on the gate insulator. Besides, the adhesive layer has a hydrophobic surface above the gate and a first hydrophilic surface and a second hydrophilic surface on two sides of the hydrophobic surface. A surface of the metal nano-particle layer is modified by a hydrophilic group, and the metal nano-particle layer is disposed on the first and the second hydrophilic surfaces of the adhesive layer as a source and a drain, respectively. The organic semiconductor layer is disposed on the hydrophobic surface of the adhesive layer and on the metal nano-particle layer.

19 Claims, 6 Drawing Sheets

U.S. PATENT DOCUMENTS

| | | |
|---|---|---|
| 2006/0160277 A1 | 7/2006 | Sirringhaus et al. |
| 2006/0189113 A1* | 8/2006 | Vanheusden et al. ........ 438/597 |
| 2007/0096088 A1* | 5/2007 | Tano et al. .................... 257/40 |
| 2007/0152210 A1* | 7/2007 | Han et al. ..................... 257/40 |
| 2008/0265414 A1* | 10/2008 | Ho et al. ..................... 257/741 |

OTHER PUBLICATIONS

Liu, S., et al. "Template Guided Self-Assembly of [Au55] Clusters on Nanolithographically Defined Monolayer Patterns." Nanolett., vol. 2 (2002): pp. 1055-1060.*

Liu, S., et al. "Planned Nanostructures fo Colloidal Gold via Self-Assembly on Hierarchically Assembled Organic Bilayer Template Patterns with In-Situ Generated Terminal Amino Functionality." Nanolett., vol. 4, (2004): pp. 845-851.*

Shon, Y.-S. & Choo, H. "Organic Reactions of Monolayer-Protected Metal Nanoparticles." C.R. CHIMIE, vol. 6 (2003): pp. 1009-1018.*

"Enabling Gate Dielectric Design for All Solution-Processed, High-Performance, Flexible Organic Thin-Film Transistors", J. Am. Chem. Soc. 2006, 128, pp. 4554-4555. Published on Web Mar. 10, 2006.

* cited by examiner

ORGANIC THIN FILM TRANSISTOR AND METHOD FOR MANUFACTURING THE SAME

CROSS-REFERENCE TO RELATED APPLICATION

This application claims the priority benefit of Taiwan application serial no. 96100086, filed on Jan. 2, 2007. All disclosure of the Taiwan application is incorporated herein by reference.

BACKGROUND OF THE INVENTION

1. Field of the Invention

The present invention generally relates to a thin film transistor (TFT) and a method of manufacturing the same, and more particularly to an organic thin film transistor (OTFT) and a method of manufacturing the same.

2. Description of Related Art

The principles of operating a TFT are similar to those of operating a conventional metallic-oxide-semiconductor (MOS) transistor. Both the TFT and the MOS transistor have three terminals (a gate, a drain and a source). Each TFT functions as a switching element inside a liquid crystal display (LCD) pixel unit.

Currently, an organic thin film transistor (OTFT) has been developed in the industry. In comparison with the conventional TFT, the OTFT has advantages of lower processing temperature and lower manufacturing costs. Moreover, the OTFT can be applied to an active driving display, an IC card or other economical electronic products when the OTFT technology is adopted to plastic substrates.

U.S. Publication No. 2005/0242342 titled "ORGANIC THIN FILM TRANSISTOR INCLUDING ORGANIC ACCEPTOR FILM" and U.S. Publication No. 2006/0027805 titled "THIN FILM TRANSISTOR AND METHOD OF FABRICATING THE SAME" both disclose the OTFT-related technologies. The manufacturing process provided by the two U.S. publications is performed not only by a physical vapor deposition (PVD) and a chemical vapor deposition (CVD), but also by a vacuum deposition and photolithography. Thereby, the manufacturing costs are increased, and the acid or base solution does harm to material layers such as the organic semiconductor layers during the photolithography process.

On the other hand, the OTFT-related technologies are also disclosed in the non-patent reference titled "Enabling Gate Dielectric Design for All Solution-Processed, High-Performance, Flexible Organic Thin-Film Transistors" by *J. Am. Chem. Soc.* 2006, 128, p4554-4555. The technical feature thereof mainly lies in that a gold nano-particle layer is formed on an adhesive layer of a gate insulator as a source and a drain through a transfer printing method. However, adhesion among the material layers disclosed in the reference is undesirable due to the hydrophobic properties thereof. Furthermore, a mixing reaction frequently occurs among each of the material layers, which adversely affects the performance of the devices.

Hence, a method for manufacturing the OTFT with lower manufacturing costs and better performance has become an essential topic in the industry.

SUMMARY OF THE INVENTION

In view of the foregoing, the present invention provides an OTFT to improve adhesion among film layers and to boost the performance of devices.

The present invention further provides a method of manufacturing an OTFT so as to facilitate the site selective properties of the adhesive layer, and reduce the photomask processes and the manufacturing costs.

The present invention provides an OTFT including a substrate, a gate, a gate insulator, an adhesive layer, a metal nano-particle layer and an organic semiconductor layer. The gate is disposed on the substrate. The gate insulator is disposed on the gate and the substrate. The adhesive layer is disposed on the gate insulator. Besides, the adhesive layer has a hydrophobic surface above the gate and a first hydrophilic surface and a second hydrophilic surface on two sides of the hydrophobic surface. The surface of the metal nano-particle layer is modified by a hydrophilic group, and the metal nano-particle layer is disposed on the first and the second hydrophilic surfaces of the adhesive layer as a source and a drain, respectively. The organic semiconductor layer is disposed on the hydrophobic surface of the adhesive layer and on the metal nano-particle layer.

According to one embodiment of the present invention, the adhesive layer is a silane material layer including a hydrophobic surface and two hydrophilic surfaces.

According to one embodiment of the present invention, the adhesive layer is a stacked material layer. In one embodiment, the stacked material layer is constructed by a hydrophilic silane material layer and a hydrophobic material layer. Here, the hydrophilic silane material layer is disposed on the gate insulator, and the hydrophobic material layer is disposed on the hydrophilic silane material layer above the gate. In another embodiment, the stacked material layer is constructed by a hydrophobic silane material layer and a hydrophilic material layer. Here, the hydrophobic silane material layer is disposed on the gate insulator, and the hydrophilic material layer is disposed on two sides of the hydrophobic silane material layer above the gate.

According to one embodiment of the present invention, the hydrophilic group includes, for example, a hydroxyl group (—OH), an amino group (—NH$_2$), a thiol group (—SH) or a carboxyl group (—COOH).

According to one embodiment of the present invention, the material of the metal nano-particle layer includes gold nano-particles, silver nano-particles, palladium nano-particles, or copper nano-particles.

According to one embodiment of the present invention, the material of the organic semiconductor layer includes, for example, pentacene, poly(9,9-dioctylfluorenecobithiophene) (F8T2), or poly(thiophene) derivatives.

According to one embodiment of the present invention, the material of the gate includes, for example, metals, an alloy of metals, or metal nano-particles.

According to one embodiment of the present invention, the material of the gate insulator includes a silicon-containing compound.

The present invention further provides a method of manufacturing an OTFT. The method includes forming a gate on a substrate first. Next, a gate insulator is formed to cover the gate and the substrate. Then, an adhesive layer is formed on the gate insulator. Here, the adhesive layer has a hydrophobic surface above the gate and a first hydrophilic surface and a second hydrophilic surface on two sides of the hydrophobic surface. Thereafter, a metal nano-particle layer is formed. The surface of the metal nano-particle layer is modified by a hydrophilic group, such that the metal nano-particles are selectively attached to the first and the second hydrophilic surfaces as a source and a drain, respectively. Finally, an organic semiconductor layer is formed on the hydrophobic surface of the adhesive layer and on the metal nano-particle layer.

According to one embodiment of the present invention, the method of forming the adhesive layer includes, for example, forming a silane material layer on the gate insulator. A surface of the silane material layer is characterized by hydrophobic properties. Then, an illumination treatment is performed to transform a portion of the surface of the silane material layer above two sides of the gate to a hydrophilic surface.

According to one embodiment of the present invention, the adhesive layer is a stacked material layer. In one embodiment, the method of forming the adhesive layer includes, for example, forming a hydrophilic silane material layer on the gate insulator and then forming a hydrophobic material layer on the hydrophilic silane material layer above the gate. In another embodiment, the method of forming the adhesive layer includes, for example, forming a hydrophobic silane material layer on the gate insulator and then forming a hydrophilic material layer on two sides of the hydrophobic silane material layer above the gate.

According to one embodiment of the present invention, the hydrophilic group includes, for example, —OH, —NH$_2$, —SH or —COOH.

According to one embodiment of the present invention, the method of forming the metal nano-particle layer for selectively attaching the metal nano-particles to the first and the second hydrophilic surfaces includes, for example, performing an ink-jet process or a transfer printing process.

According to one embodiment of the present invention, the material of the metal nano-particle layer includes Au nano-particles, Ag nano-particles, Pd nano-particles, or Cu nano-particles.

According to one embodiment of the present invention, the material of the organic semiconductor layer includes, for example, pentacene, F8T2, or poly(thiophene) derivatives.

According to one embodiment of the present invention, the material of the gate includes, for example, a metal, an alloy of metals, or metal nano-particles.

According to one embodiment of the present invention, the material of the gate insulator is a silicon-containing compound.

The present invention adopts the metal nano-particle layer as the source and the drain. Therefore, the photolithography and etching process is eliminated, and accordingly one photomask process is omitted. In addition, the source and the drain in the present invention are formed neither by a conventional sputtering method nor by a conventional thermal evaporation method, which avoids the devices from being damaged and reduces the costs. On the other hand, since the method provided by the present invention is not completely performed through a vapor deposition, the manufacturing costs are further decreased. Besides, the adhesive layer of the present invention improves adhesion not only between the metal nano-material layer and the gate insulator but also between the organic semiconductor layer and the gate insulator, such that the performance of the devices is enhanced. And the adhesive layer of the present invention has an alternate surface structure (hydrophilic/hydrophobic/hydrophilic); namely, the site selective properties are achieved in the present invention. Thus, the metal nano-particle layer and the organic semiconductor layer are respectively formed on two sides and in the middle of the adhesive layer.

In order to make the above and other objects, features and advantages of the present invention more comprehensible, several embodiments accompanied with figures are described in detail below.

DESCRIPTION OF EMBODIMENTS

FIGS. 1A through 1D are cross-sectional views illustrating the steps of manufacturing an OTFT according to an embodiment of the present invention.

Figure 1A:
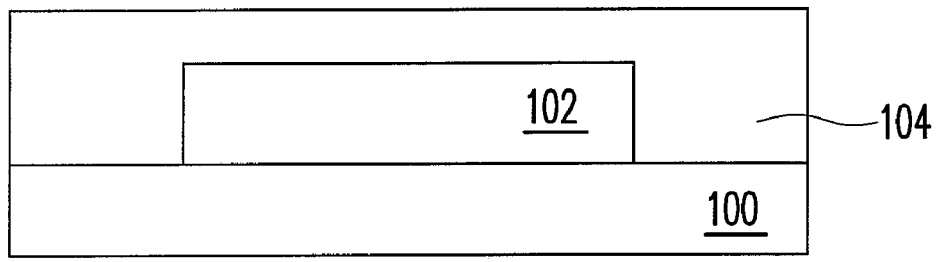
FIGS. 1A through 1D are cross-sectional views illustrating the steps of manufacturing an OTFT according to an embodiment of the present invention.

Referring to FIG. 1A, a substrate 100 is provided. The substrate 100 is, for example, a plastic substrate or a glass substrate. Next, a gate 102 is formed on the substrate 100. The material of the gate 102 includes, for example, chromium (Cr), aluminum (Al), aluminum neodymium (AlNd), other appropriate metals, or an alloy of metals. The method for forming the gate 102 includes, for example, performing a CVD process or a PVD process. It is certain that the material of the gate 102 can be, for example, Au nano-particles, Ag nano-particles, Pd nano-particles, Cu nano-particles or other appropriate metal nano-particles, and the method of forming the gate 102 includes, for example, performing a transfer printing process or an ink-jet process.

Again, referring to FIG. 1A, a gate insulator 104 is formed to cover the gate 102 and the substrate 100. The material of the gate insulator 104 is a silicon-containing compound, such as silicon oxide, silicon nitride or other appropriate silicon-containing dielectric layers. The gate insulator 104 is formed by performing the CVD process, for example. Alternatively, the gate insulator 104 may be formed by performing a high temperature curing process on silicon dioxide sol-gel, for example.

Figure 1B:
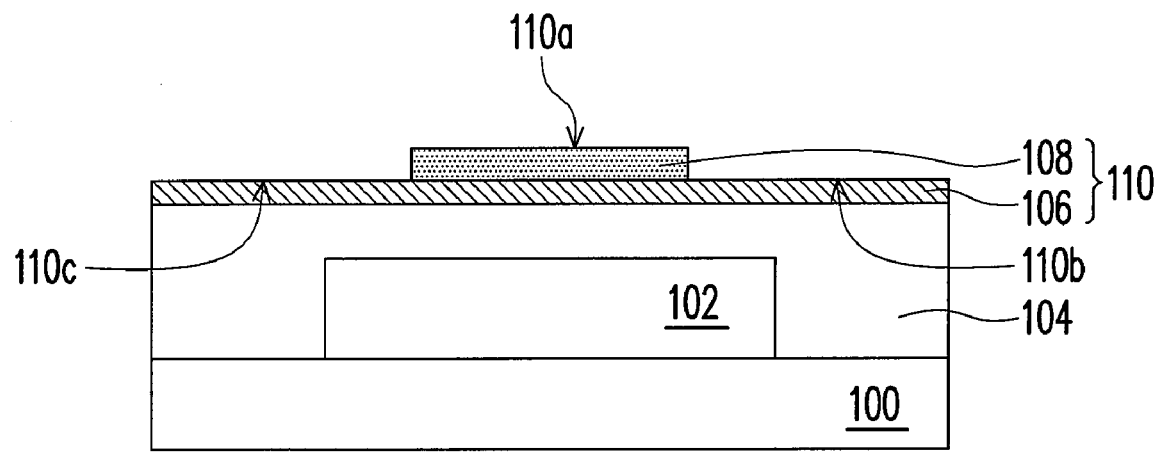

Then, referring to FIG. 1B, a hydrophilic silane material layer 106 is formed on the gate insulator 104. The method of forming the hydrophilic silane material layer 106 on the gate insulator 104 includes performing a spin-coating process, for example. Thereby, a silane material layer having OH, —NH$_2$, —SH, —COOH, or other appropriate functional groups on the surface thereof is formed on the gate insulator 104. A silanization reaction is performed between the surface of the gate insulator 104 and the silane material layer, and then the hydrophilic group is exposed on the top surface of the silane material layer so as to present hydrophilic features. Again, referring to FIG. 1B, a hydrophobic material layer 108 is formed on the hydrophilic silane material layer 106 above the gate 102. The method of forming the hydrophobic material layer 108 includes, for example, performing a transfer printing to form an amphoteric compound layer having OH, —NH$_2$, —SH, —COOH, or other appropriate functional groups on the hydrophilic silane material layer 106 above the gate 102. The functional group bonds to the surface of the hydrophilic silane material layer 106, and thus the amphoteric compound layer has a hydrophobic surface.

The material of the amphoteric compound layer having a carboxyl group (—COOH) includes octanoic acid, decanoic acid, dodecanoic acid, tetradecanoic acid, hexadecanoic acid, octadecanoic acid, or propionic acid. The material of the amphoteric compound layer having an amino group (—NH$_2$) includes n-hexylamine, n-octylamine, n-nonylamine, n-heptylamine, n-butylamine or propylamine. The material of the amphoteric compound layer having a thiol group (—SH) includes 1-pentanethiol, 1-hexanethiol, 1-heptanethiol, 1-octanethiol, 1-nonanethiol, 1-decanethiol, 1-dodecanol or 1-undecanol. The material of the amphoteric compound layer having a hydroxyl group (—OH) includes n-propanol, n-pentanol, n-hexanol, n-dodecanol, n-heptanol, n-octanol or n-nontanol.

It should be particularly noted that a stacked material layer constructed by the hydrophilic silane material layer 106 and the hydrophobic material layer 108 may be used as an adhesive layer 110. The adhesive layer 110 has a hydrophobic surface 110a above the gate 102 and two hydrophilic surfaces 110b and 110c on two sides of the hydrophobic surface 110a, such that the adhesive layer 110 has an alternate surface structure (hydrophilic/hydrophobic/hydrophilic).

Figure 1C:
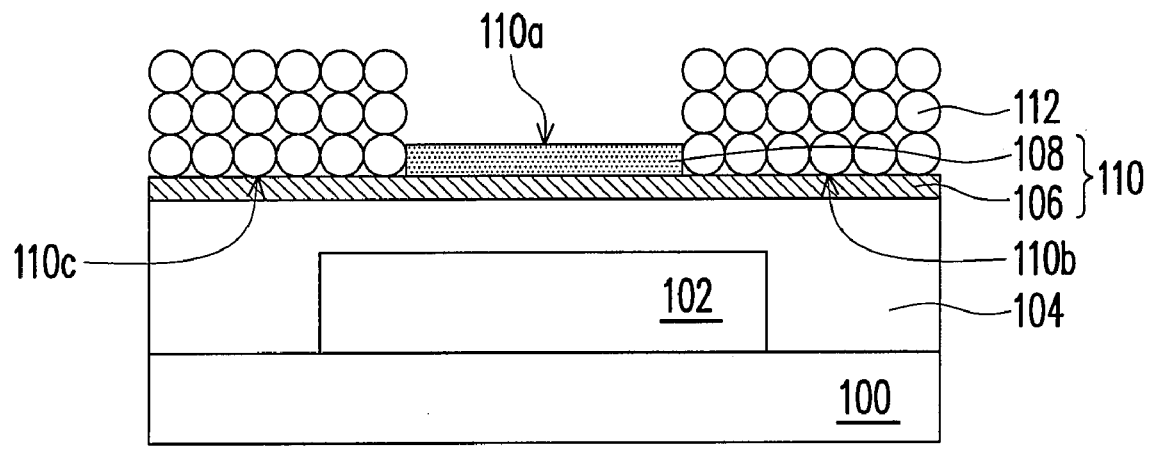

Then, referring to FIG. 1C, a metal nano-particle layer 112 is formed on the adhesive layer 110. Here, the surface of the metal nano-particle layer is modified by —OH, —NH$_2$, —SH, —COOH or other appropriate hydrophilic groups. The material of the metal nano-particle layer 112 includes, for example, Au nano-particles, Ag nano-particles, Pd nano-particles, Cu nano-particles or other appropriate metal nano-particles. The method of forming the metal nano-particle layer 112 on the adhesive layer 110 includes, for example, performing an ink-jet process to form the metal nano-particle layer 112 having a surface modified by the hydrophilic group over the adhesive layer 110, and the metal nano-particle layer 112 having the modified surface is selectively attached to the hydrophilic surfaces 110b and 110c of the adhesive layer 110 in the forms of covalent bonds or hydrogen bonds. According to one embodiment, the method of forming the metal nano-particle layer 112 on the adhesive layer 110 includes performing the transfer printing, for example.

The metal nano-particle layer 112 formed on the hydrophilic surfaces 110b and 110c of the adhesive layer 110 may be utilized as a source and a drain of the OTFT. Using the metal nano-particle layer as the source and the drain in the OTFT leads to an elimination of a photolithography and etching process so as to omit a photomask process. In addition, the source and the drain in the present invention are formed neither by a conventional sputtering method nor by a conventional thermal evaporation method, which avoids the devices from being damaged and reduces the costs.

Figure 1D:
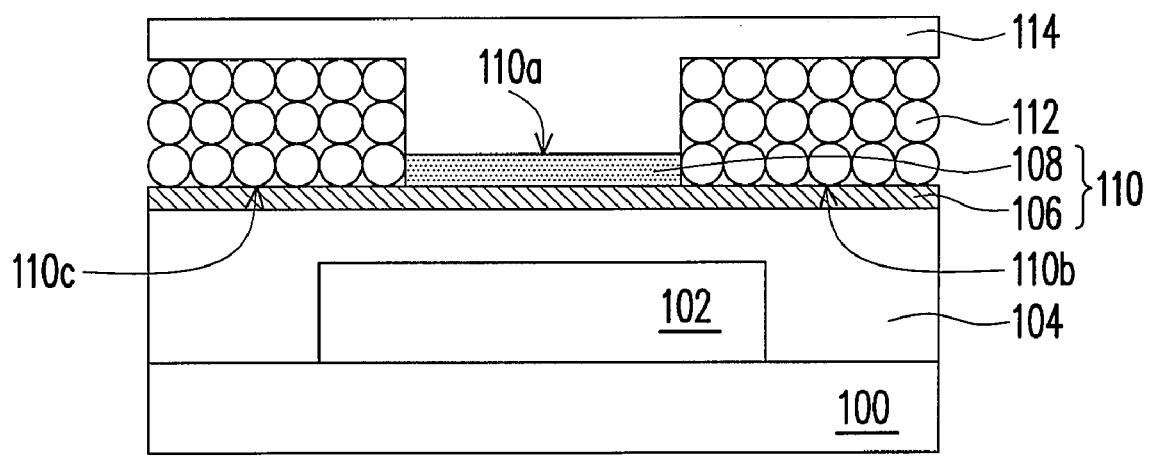

Thereafter, referring to FIG. 1D, an organic semiconductor layer 114 is formed on the adhesive layer 110 and on the metal nano-particle layer 112 after the metal nano-particle layer 112 is formed. The material of the organic semiconductor layer 114 includes, for example, pentacene, poly(9,9-dioctylfluoreneco-bithiophene) (F8T2), or poly(thiophene) derivatives. The poly(thiophene) derivatives may be poly-(3-hexylthiophene)(P3HT), for example. The method of forming the organic semiconductor layer 114 on the adhesive layer 110 and on the metal nano-particle layer 112 includes performing a spin-coating process or an ink-jet process to form the organic semiconductor layer 114 on the hydrophobic surface 110a of the adhesive layer 110 and on the metal nano-particle layer 112.

Particularly speaking, during the formations of the metal nano-particle layer 112 and the organic semiconductor layer 114, the site selective properties of the surface of the adhesive layer 110 enable the respective formations of the metal nano-particle layer 112 and of the organic semiconductor layer 114 on two sides and in the middle of the adhesive layer 110 due to the alternate surface structure (hydrophilic/hydrophobic/hydrophilic) of the adhesive layer 110. Moreover, the adhesive layer 110 improves adhesion not only between the metal nano-material layer 112 and the gate insulator 104 but also between the organic semiconductor layer 114 and the gate insulator 104. Thus, the performance of the devices is enhanced.

On the other hand, since the method of manufacturing the OTFT in the present invention is not completely performed through a vapor deposition, the manufacturing costs are further decreased.

In addition to the above embodiments, the present invention also provides other implementations. FIGS. 2A through 2D are cross-sectional views illustrating the steps of manufacturing an OTFT according to another embodiment of the present invention. In FIGS. 2A through 2D, the same reference numbers are used to denote the same parts in FIGS. 1A through 1D, and the illustrations thereof are omitted herein.

Figure 2A:
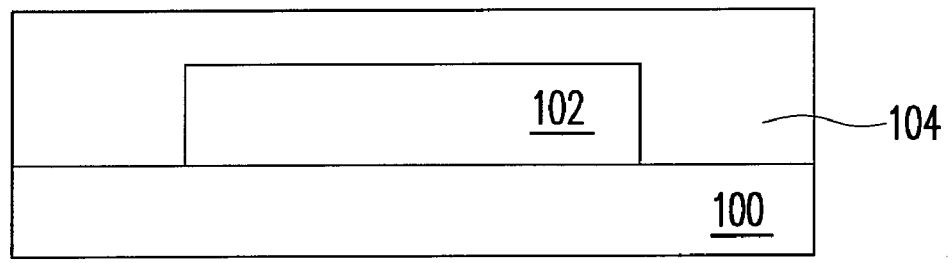
FIGS. 2A through 2D are cross-sectional views illustrating the steps of manufacturing an OTFT according to another embodiment of the present invention.

First, referring to FIG. 2A, a gate 102 is formed on a substrate 100. After the gate 102 is formed, a gate insulator 104 is formed to cover the gate 102 and the substrate 100.

Figure 2B:
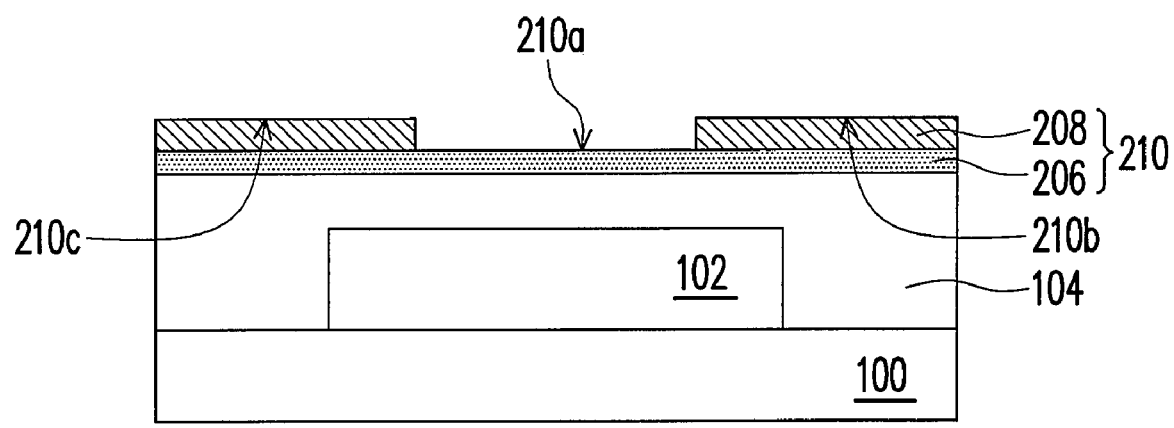

Then, referring to FIG. 2B, a hydrophobic silane material layer 206 is formed on the gate insulator 104. The method of forming the hydrophobic silane material layer 206 on the gate insulator 104 includes performing a spin-coating process, for example. Thereby, a silane material layer having —Si(OMe)$_3$, —SiCl$_3$, or other appropriate functional groups on the surface thereof is formed on the gate insulator 104. A silanization reaction is performed between the surface of the gate insulator 104 and the silane material layer. The functional group on the surface of the silane material layer bonds to the gate insulator 104, and thus the silane material layer presents hydrophobic features.

Again, referring to FIG. 2B, a hydrophilic material layer 208 is formed on two sides of the hydrophobic silane material layer 206 above the gate 102. The method of forming the hydrophilic material layer 208 includes, for example, performing a transfer printing to form an amphoteric compound layer having OH, —NH$_2$, —SH, —COOH, or other appropriate functional groups on two sides of the hydrophobic silane material layer 206 above the gate 102. After the amphoteric compound layer bonds to the surface of the hydrophobic silane material layer 206, the functional group is exposed on the surface of the amphoteric compound layer, and thus the amphoteric compound layer has a hydrophilic surface.

The material of the amphoteric compound layer having the carboxyl group (—COOH) includes octanoic acid, decanoic acid, dodecanoic acid, tetradecanoic acid, hexadecanoic acid, octadecanoic acid, or propionic acid. The material of the amphoteric compound layer having the amino group (—NH$_2$) includes n-hexylamine, n-octylamine, n-nonylamine, n-heptylamine, n-butylamine or propylamine. The material of the amphoteric compound layer having the thiol group (—SH) includes 1-pentanethiol, 1-hexanethiol, 1-heptanethiol, 1-octanethiol, 1-nonanethiol, 1-decanethiol, 1-dodecanol or 1-undecanol. The material of the amphoteric compound layer having the hydroxyl group (—OH) includes n-propanol, n-pentanol, n-hexanol, n-dodecanol, n-heptanol, n-octanol or n-nontanol.

It should be particularly noted that a stacked material layer constructed by the hydrophobic silane material layer 206 and the hydrophilic material layer 208 may be used as an adhesive layer 210. The adhesive layer 210 has a hydrophobic surface 210a above the gate 102 and two hydrophilic surfaces 210b and 210c on two sides of the hydrophobic surface 210a, such that the adhesive layer 210 has an alternate surface structure (hydrophilic/hydrophobic/hydrophilic).

Figure 2C:
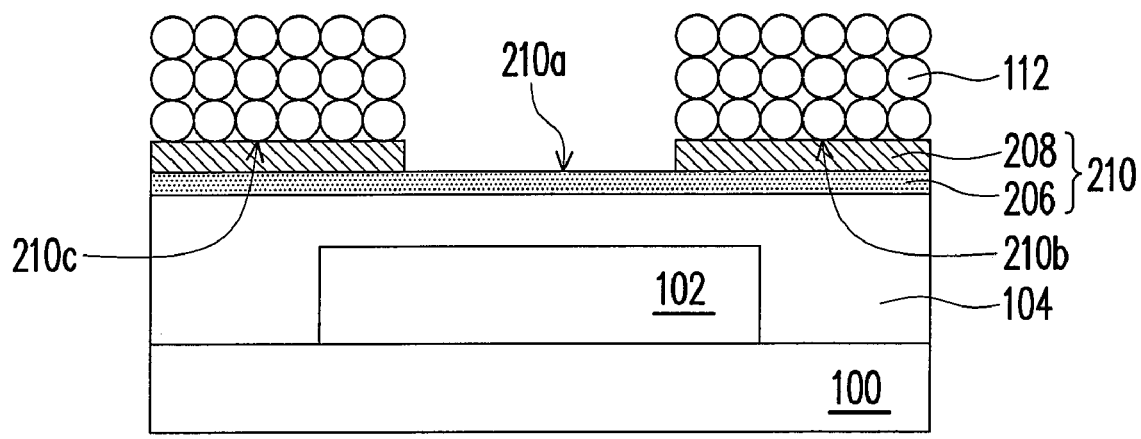

Thereafter, referring to FIG. 2C, after the adhesive layer 210 is formed, a metal nano-particle layer 112 is formed thereon. The method of forming the metal nano-particle layer 112 on the adhesive layer 210 includes, for example, performing an ink-jet process to form the metal nano-particle layer 112 having a surface modified by the hydrophilic group over the adhesive layer 210, and the metal nano-particle layer having the modified surface is selectively attached to the hydrophilic surfaces 210b and 210c of the adhesive layer 210 in the forms of covalent bonds or hydrogen bonds. According to one embodiment, the method of forming the metal nano-particle layer 112 on the adhesive layer 210 includes performing a transfer printing, for example. The metal nano-particle layer 112 formed on the hydrophilic surfaces 210b and 210c of the adhesive layer 210 can be utilized as a source and a drain of the OTFT.

Figure 2D:
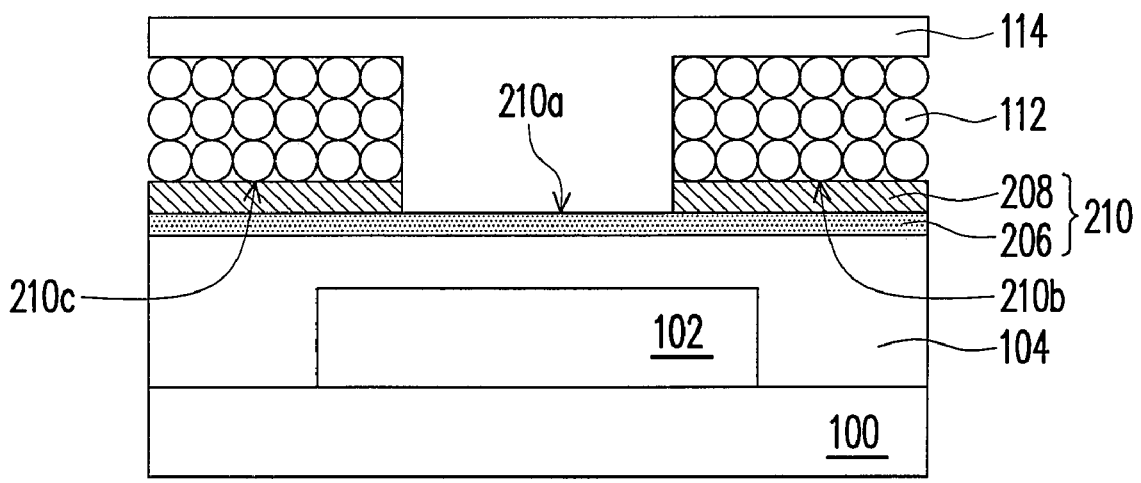

Next, referring to FIG. 2D, an organic semiconductor layer 114 is formed on the adhesive layer 210 and on the metal nano-particle layer 112 after the metal nano-particle layer 112 is formed. Thus, during the formations of the metal nano-particle layer 112 and the organic semiconductor layer 114, the site selective properties of the surface of the adhesive layer 210 enable the respective formations of the metal nano-particle layer 112 and of the organic semiconductor layer 114 on two sides and in the middle of the adhesive layer 210 due to the alternate surface structure (hydrophilic/hydrophobic/hydrophilic) of the adhesive layer 210. Moreover, the adhesive layer 210 improves adhesion not only between the metal nano-material layer 112 and the gate insulator 104 but also between the organic semiconductor layer 114 and the gate insulator 104. Thus, the performance of the devices is enhanced.

FIGS. 3A through 3D are cross-sectional views illustrating the steps of manufacturing an OTFT according to still another embodiment of the present invention. In FIGS. 3A through 3D, the same reference numbers are used to denote the same parts in FIGS. 1A through 1D, and the illustrations thereof are omitted herein.

Figure 3A:
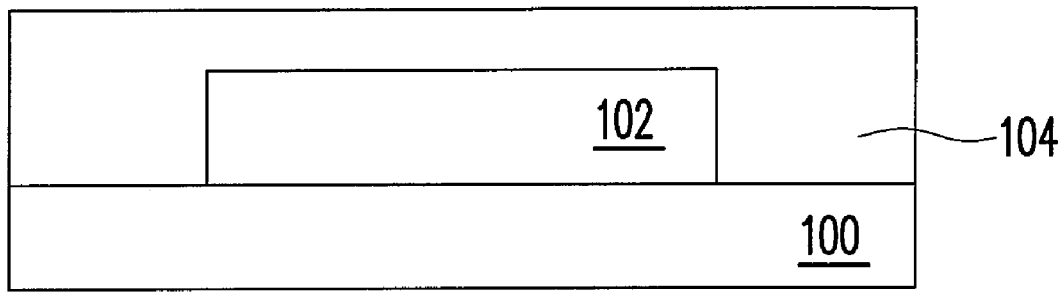
FIGS. 3A through 3D are cross-sectional views illustrating the steps of manufacturing an OTFT according to still another embodiment of the present invention.

First, referring to FIG. 3A, a gate 102 is formed on a substrate 100. After the gate 102 is formed, a gate insulator 104 is formed to cover the gate 102 and the substrate 100.

Figure 3B:
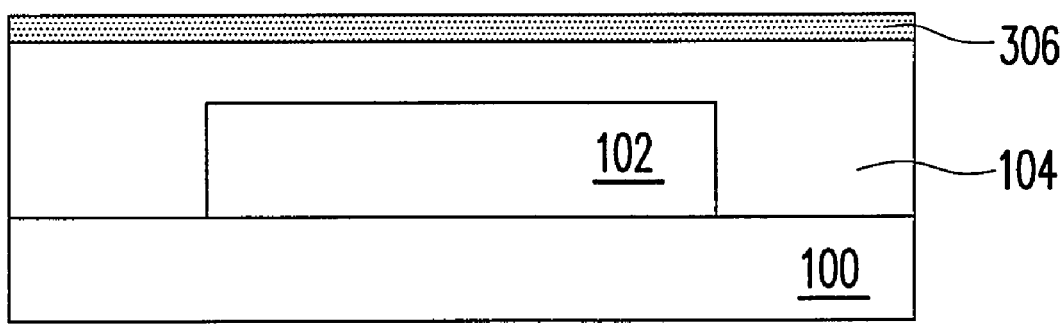

Then, referring to FIG. 3B, a silane material layer 306 having a hydrophobic surface is formed on the gate insulator 104. The method of forming the silane material layer 306 on the gate insulator 104 includes, for example, performing a spin-coating process to form a silane material layer having —Si(OMe)$_3$, —SiCl$_3$, or other appropriate functional groups on the surface thereof on the gate insulator 104. A silanization reaction is performed between the surface of the gate insulator 104 and the silane material layer. The functional group on the surface of the silane material layer bonds to the gate insulator 104, and thus the silane material layer presents hydrophobic features.

Figure 3C:
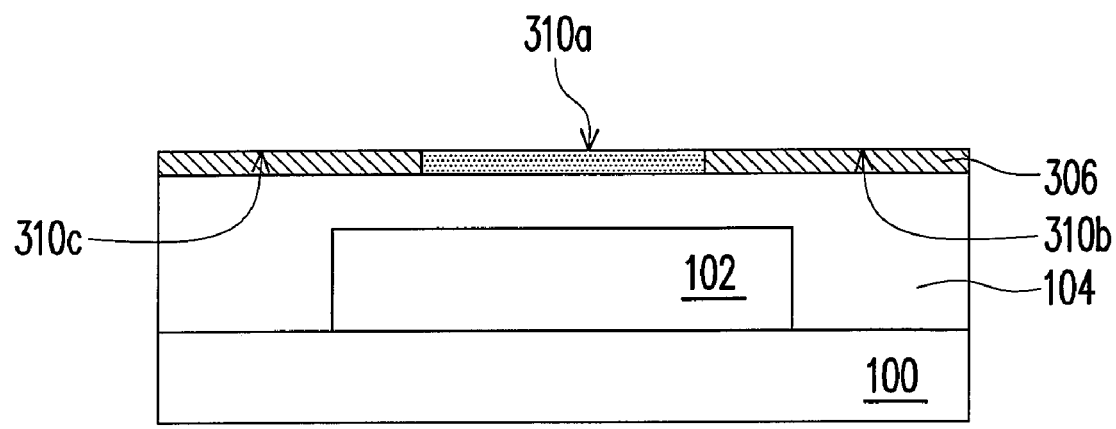

Then, referring to FIG. 3C, after the silane material layer 306 is formed, an illumination treatment is undertaken, such that a portion of the surface of the silane material layer 306 is transformed to a hydrophilic surface. The illumination treatment is performed by using an ultraviolet light source emitting light through a patterned photomask (not shown). Here, the surface of the silane material layer 306 above the gate 102 is not exposed to the light, and thus the surface still presents hydrophobic features (a hydrophobic surface 310a). On the contrary, the surfaces of the silane material layer above two sides of the gate 102 are exposed to the light and are oxidized, and thus the surfaces present hydrophilic features (hydrophilic surfaces 310b and 310c). The silane material layer 306 can be utilized as an adhesive layer having the hydrophobic surface 310a and the two hydrophilic surfaces 310b and 310c; namely, the silane material layer 306 has an alternate surface structure (hydrophilic/hydrophobic/hydrophilic).

Figure 3D:
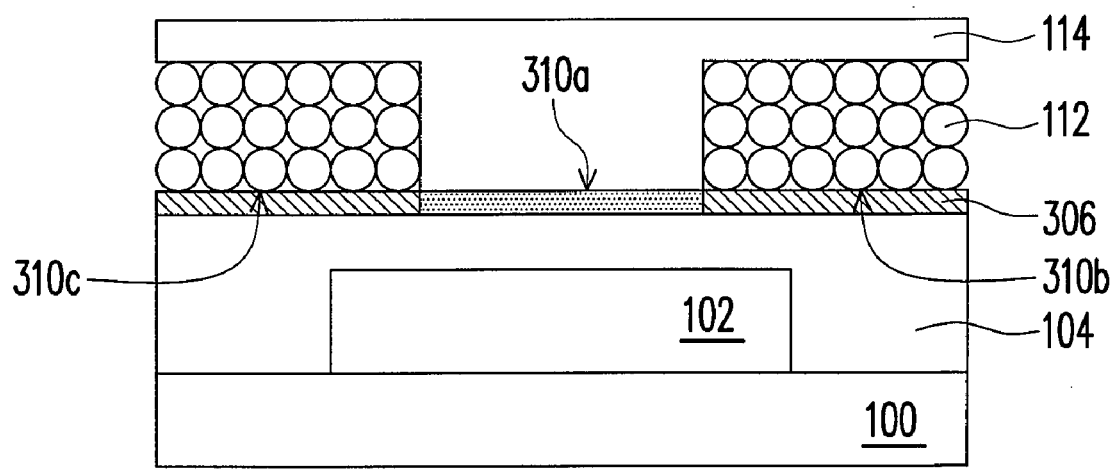

Thereafter, referring to FIG. 3D, after the silane material layer 306 is formed, a metal nano-particle layer 112 is formed thereon. The method of forming the metal nano-particle layer 112 on the silane material layer 306 includes, for example, performing an ink-jet process to form the metal nano-particle layer 112 having a surface modified by the hydrophilic groups over the silane material layer 306, and the metal nano-particle layer is selectively attached to the hydrophilic surfaces 310b and 310c of the silane material layer 306 in the forms of covalent bonds or hydrogen bonds. According to one embodiment, the method of forming the metal nano-particle layer 112 on the silane material layer 306 includes performing a transfer printing, for example. The metal nano-particle layer 112 formed on the hydrophilic surfaces 310b and 310c of the silane material layer 306 can be utilized as a source and a drain of the OTFT.

Next, referring to FIG. 3D, an organic semiconductor layer 114 is formed on the silane material layer 306 and on the metal nano-particle layer 112 after the metal nano-particle layer 112 is formed. Thus, during the formations of the metal nano-particle layer 112 and the organic semiconductor layer 114, the site selective properties of the surface of the silane material layer 306 enable the respective formations of the metal nano-particle layer 112 and of the organic semiconductor layer 114 on two sides and in the middle of the silane material layer 306 due to the alternate surface structure (hydrophilic/hydrophobic/hydrophilic) of the silane material layer 306. Moreover, the silane material layer 306 used as the adhesive layer improves adhesion not only between the metal nano-material layer 112 and the gate insulator 104 but also between the organic semiconductor layer 114 and the gate insulator 104. Thus, the performance of the devices is enhanced.

Next, the structure of the OTFT provided by the present invention will be illustrated hereinafter according to FIGS. 1D, 2D and 3D depicting the embodiments.

Referring to FIGS. 1D, 2D and 3D together, the OTFT includes the substrate 100, the gate 102, the gate insulator 104, the adhesive layer, the metal nano-particle layer 112 and the organic semiconductor 114. The gate 102 is disposed on the substrate 100. The material of the substrate 100 is, for example, the plastic substrate or the glass substrate, and the material of the gate 102 includes, for example, Au nano-particles, Ag nano-particles, Pd nano-particles, Cu nano-particles or other appropriate metal nano-particles. In addition, the gate insulator 104 is disposed on the gate 102 and the substrate 100. The material of the gate insulator 104 is a silicon-containing compound, such as silicon oxide, silicon nitride, or silicon dioxide sol-gel, for example.

In the present invention, the adhesive layer of the OTFT is disposed on the gate insulator 104. Besides, the adhesive layer has the hydrophobic surface above the gate 102 and the two hydrophilic surfaces on the two sides of the hydrophobic surface. As shown in FIG. 1D, the adhesive layer 110 is a stacked material layer formed by the hydrophilic silane material layer 106 and the hydrophobic material layer 108. Here, the hydrophilic silane material layer 106 is disposed on the gate insulator 104, while the hydrophobic material layer 108 is disposed on the hydrophilic silane material layer 106 above the gate 102. And the adhesive layer 110 has the hydrophobic surface 110a above the gate 102 and the two hydrophilic surfaces 110b and 110c on the two sides of the hydrophobic surface 110a. As shown in FIG. 2D, the adhesive layer 210 is the stacked material layer formed by the hydrophobic silane material layer 206 and the hydrophilic material layer 208. Here, the hydrophobic silane material layer 206 is disposed on the gate insulator 104, while the hydrophilic material layer 208 is disposed on the two sides of the hydrophobic silane material layer 206 above the gate 102. And the adhesive layer 210 has the hydrophobic surface 210a above the gate 102 and the two hydrophilic surfaces 210b and 210c on the two sides of the hydrophobic surface 210a. As shown in FIG. 3D, the adhesive layer in this embodiment refers to the silane material layer 306 having the hydrophobic surface 310a and the two hydrophilic surfaces 310b and 310c on the two sides of the hydrophobic surface 310a.

The surface of the metal nano-particle layer 112 is modified by —OH, —NH$_2$, —SH, —COOH or other appropriate hydrophilic groups, and the metal nano-particle layer 112 is disposed on the two hydrophilic surfaces of the adhesive layer as the source and the drain of the OTFT, respectively. The material of the metal nano-particle layer 112 includes, for example, Au nano-particles, Ag nano-particles, Pd nano-particles, Cu nano-particles or other appropriate metal nano-particles. The organic semiconductor layer 114 is disposed on the hydrophobic surface of the adhesive layer and on the metal nano-particle layer 112. The material of the organic semiconductor layer 114 includes, for example, pentacene, F8T2, or poly(thiophene) derivatives. The poly(thiophene) derivatives may be P3HT, for example.

It is learned from the above that the adhesive layer of the present invention has the alternate surface structure (hydrophilic/hydrophobic/hydrophilic), and thus the site selective properties of the surface of the adhesive layer enable the respective formations of the metal nano-particle layer and of the organic semiconductor layer on the two sides and in the middle of the adhesive layer. Besides, the adhesive layer improves adhesion not only between the metal nano-material layer and the gate insulator but also between the organic semiconductor layer and the gate insulator, such that the performance of the devices is enhanced.

In view of the foregoing, the OTFT and the method of manufacturing the same in the present invention have at least the following advantages:

1. The present invention uses the metal nano-particle layer as the source and the drain. Therefore, the photolithography and etching process is eliminated, and accordingly one photomask process is omitted. In addition, the source and the drain in the present invention are formed neither by the conventional sputtering method nor by the conventional thermal evaporation method, which avoids the devices from being damaged and reduces the costs.

2. The adhesive layer of the present invention improves adhesion not only between the metal nano-material layer and the gate insulator but also between the organic semiconductor layer and the gate insulator, such that the performance of the devices is enhanced.

3. The adhesive layer of the present invention has the alternate surface structure (hydrophilic/hydrophobic/hydrophilic); namely, the site selective properties are achieved in the present invention. Thus, the metal nano-particle layer and the organic semiconductor layer are respectively formed on the two sides and in the middle of the adhesive layer.

4. Since the method provided by the present invention is not completely performed through the vapor deposition, the manufacturing costs are further decreased.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An organic thin film transistor (OTFT), comprising:
   a substrate;
   a gate disposed on the substrate;
   a gate insulator disposed on the substrate and covering the gate, wherein the gate insulator comprises a silicon-containing compound;
   an adhesive layer disposed on the gate insulator, wherein the adhesive layer has a hydrophobic surface above the gate and a first hydrophilic surface and a second hydrophilic surface on two sides of the hydrophobic surface, and the adhesive layer is a silane material layer such that a silanization reaction is between the surface of the gate insulator and the silane material layer;
   a metal nano-particle layer, a surface thereof being modified by a hydrophilic group, the metal nano-particle layer being disposed on the first and the second hydrophilic surfaces of the adhesive layer as a source and a drain, respectively; and
   an organic semiconductor layer disposed on the hydrophobic surface of the adhesive layer and on the metal nano-particle layer.

2. The OTFT of claim 1, wherein the silane material layer comprises a hydrophobic surface and two hydrophilic surfaces.

3. The OTFT of claim 1, wherein the adhesive layer is a stacked material layer.

4. The OTFT of claim 3, wherein the stacked material layer comprises:
   a hydrophilic silane material layer disposed on the gate insulator; and
   a hydrophobic material layer disposed on the hydrophilic silane material layer above the gate.

5. The OTFT of claim 3, wherein the stacked material layer comprises:
   a hydrophobic silane material layer disposed on the gate insulator; and
   a hydrophilic material layer disposed on two sides of the hydrophobic material layer above the gate.

6. The OTFT of claim 1, wherein the hydrophilic group comprises a hydroxyl group (—OH), an amino group (—NH$_2$), a thiol group (—SH) or a carboxyl group (—COOH).

7. The OTFT of claim 1, wherein the material of the metal nano-particle layer comprises gold nano-particles, silver nano-particles, palladium nano-particles, or copper nano-particles.

8. The OTFT of claim 1, wherein the material of the organic semiconductor layer comprises pentacene, poly(9,9-dioctylfluorene co-bithiophene) (F8T2), or poly(thiophene) derivatives.

9. The OTFT of claim 1, wherein the material of the gate comprises a metal, an alloy of metals, or metal nano-particles.

10. A method of manufacturing an organic thin film transistor (OTFT), comprising:
    forming a gate on a substrate;
    forming a gate insulator to cover the gate and the substrate, wherein the gate insulator comprises a silicon-containing compound;
    forming an adhesive layer on the gate insulator, wherein the adhesive layer has a hydrophobic surface above the gate and a first hydrophilic surface and a second hydrophilic surface on two sides of the hydrophobic surface, and the adhesive layer is a silane material layer such that a silanization reaction is between the surface of the gate insulator and the silane material layer;

forming a metal nano-particle layer having a surface modified by a hydrophilic group, such that the metal nano-particles are selectively attached to the first and the second hydrophilic surfaces as a source and a drain, respectively; and forming an organic semiconductor layer on the hydrophobic surface of the adhesive layer and on the metal nano-particle layer.

11. The method of claim 10, wherein a surface of the silane material layer being characterized by hydrophobic properties; and performing an illumination treatment to transform a portion of the surface of the silane material layer above two sides of the gate to a hydrophilic surface.

12. The method of claim 10, wherein the adhesive layer is a stacked material layer.

13. The method of claim 12, wherein the steps of forming the adhesive layer comprise:

forming a hydrophilic silane material layer on the gate insulator; and forming a hydrophobic material layer on the hydrophilic silane material layer above the gate.

14. The method of claim 12, wherein the steps of forming the adhesive layer comprise:

forming a hydrophobic silane material layer on the gate insulator; and forming a hydrophilic material layer on two sides of the hydrophobic silane material layer above the gate.

15. The method of claim 10, wherein the hydrophilic group comprises —OH, —NH$_2$, —SH or —COOH.

16. The method of claim 10, wherein the method of forming the metal nano-particle layer comprises performing an ink-jet process or a transfer printing process, such that the metal nano-particles are selectively attached to the first and the second hydrophilic surfaces.

17. The method of claim 10, wherein the material of the metal nano-particle layer comprises Au nano-particles, Ag nano-particles, Pd nano-particles or Cu nano-particles.

18. The method of claim 10, wherein the material of the organic semiconductor layer comprises pentacene, poly(9,9-dioctylfluorene co-bithiophene) (F8T2) or poly(thiophene) derivatives.

19. The method of claim 10, wherein the material of the gate comprises a metal, an alloy of metals, or metal nano-particles.

* * * * *